(12) United States Patent
Cohen et al.

(10) Patent No.: US 6,657,305 B1
(45) Date of Patent: Dec. 2, 2003

(54) SEMICONDUCTOR RECESSED MASK INTERCONNECT TECHNOLOGY

(75) Inventors: Stephen Alan Cohen, Wappingers Falls, NY (US); Timothy Joseph Dalton, Ridgefield, CT (US); John Anthony Fitzsimmons, Poughkeepsie, NY (US); Stephen McConnell Gates, Ossining, NY (US); Brian Wayne Herbst, Poughquag, NY (US); Sampath Purushothaman, Yorktown Heights, NY (US); Stanley Joseph Whitehair, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 09/703,734

(22) Filed: Nov. 1, 2000

(51) Int. Cl.[7] .................. H01L 23/48; H01L 23/52; H01L 29/40
(52) U.S. Cl. ......................................... 257/773
(58) Field of Search .................. 257/760, 773, 257/622; 438/624, 625

(56) References Cited

U.S. PATENT DOCUMENTS

| | | | | |
|---|---|---|---|---|
| 6,153,935 A | * | 11/2000 | Edelstein et al. | 257/276 |
| 6,207,556 B1 | * | 3/2001 | Hsu | 438/637 |
| 6,245,665 B1 | * | 6/2001 | Yokoyama | 438/623 |
| 6,245,683 B1 | * | 6/2001 | Liu | 438/702 |
| 6,294,835 B1 | * | 9/2001 | Dalal et al. | 257/760 |
| 6,329,701 B1 | * | 12/2001 | Ngo et al. | 257/622 |

OTHER PUBLICATIONS

"Pursuing the Perfect Low–K Dielectric", Laura Peters, Semiconductor International Magazine, Sep. 1, 1998 7 pages.

* cited by examiner

Primary Examiner—W. David Coleman
(74) Attorney, Agent, or Firm—Daniel P. Morris; Alvin J. Riddles

(57) ABSTRACT

A metal plus low dielectric constant (low-k) interconnect structure is provided for a semiconductor device wherein adjacent regions in a surface separated by a dielectric have dimensions in width and spacing in the sub 250 nanometer range, and in which reduced lateral leakage current between adjacent metal lines, and a lower effective dielectric constant than a conventional structure, is achieved by the positioning of a differentiating or mask member that is applied for the protection of the dielectric in subsequent processing operations, at a position about 2–5 nanometers below a, to be planarized, surface where there will be a lower electric field. The invention is particularly useful in the damascene type device structure in the art wherein adjacent conductors extend from a substrate through an interlevel dielectric material, connections are made in a trench, a diffusion barrier liner is provided in the interlevel dielectric material and masking is employed to protect the dielectric material between conductors during processing operations.

13 Claims, 3 Drawing Sheets

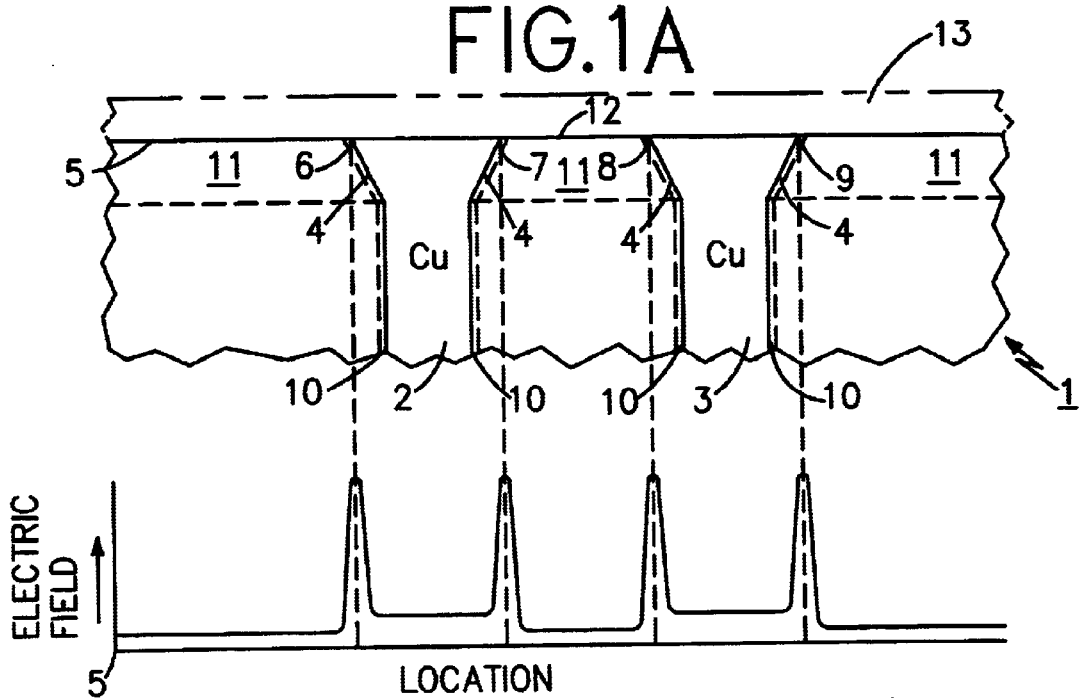
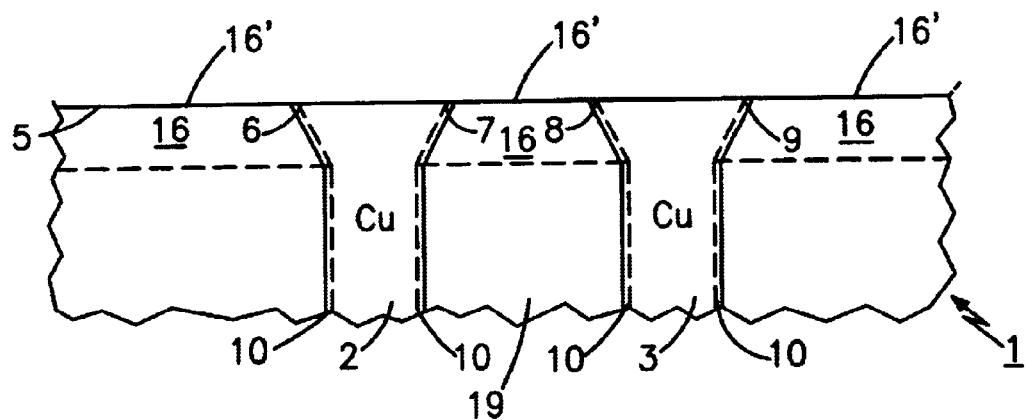
FIG. 2
PRIOR ART

SEMICONDUCTOR RECESSED MASK INTERCONNECT TECHNOLOGY

FIELD OF THE INVENTION

This invention relates to the use of a recessed mask structure to prevent localized high electrical fields at intersections with resulting lower electrical breakdown, in very small dimension semiconductor devices such as would be encountered in high speed and high density integrated circuit applications and chip interconnect structures with fine metal features and low dielectric constant insulators.

BACKGROUND OF THE INVENTION

In the miniaturizing of semiconductor devices, as the spacing and dimensions approach the below 150 nanometer range, dimensional tolerances become very small and abrupt physical discontinuities such as interfaces between different materials produce high electrical fields that in turn result in enhanced leakage and breakdown. Further, at such small dimensions, different materials than commonly used heretofore, with different properties such as lower dielectric constant (k), are being found attractive for use in lowering such device parameters as line to line capacitance, reducing cross talk noise and power dissipation. Still further, the different materials in turn behave differently in processing.

An illustration of many of the considerations involved in developing integrated circuit interconnect structures and processes where the dimensions are in the sub 250 nanometer range appears in the 7 page technical article titled "Pursuing The Perfect Low-k Dielectric", by Laura Peters, and appearing in Semiconductor International Magazine in the Sep. 1, 1998 issue.

There is a clear need in the art for a capability that will operate to provide relaxation of limitations and to reduce complexity of the situations that are being encountered in providing interconnect structures and in the fabrication thereof in the sub 250 nanometer dimension range.

SUMMARY OF THE INVENTION

A metal plus low dielectric constant (low-k) interconnect structure is provided for a semiconductor device wherein adjacent regions in a surface separated by a dielectric have dimensions in width and spacing in the sub 250 nanometer range, and in which reduced lateral leakage current between adjacent metal lines, and a lower effective dielectric constant than a conventional structure, is achieved by the positioning of a differentiating or mask member that is applied for the protection of the dielectric in subsequent processing operations, at a position below a surface to be planarized, where there will be a lower electric field. The mask position, is in the range of about 0.5 to 20 nanometers, with 5 nanometers being preferred, below the surface to be planarized, at a location where the surfaces of the regions separated by the dielectric are undisturbed and have complete integrity. The invention is particularly useful in the damascene type device structure in the art wherein adjacent conductors lined with an electrically conductive and diffusion barrier film are disposed in thin trenches in an intralevel dielectric material (WLD), connections are made to levels above and below diffusion barrier film are disposed in thin trenches in an intralevel dielectric material (ILD), connections are made to levels above and below through metal filled vias in the ILD, masking is employed both to protect the dielectric material between conductors during processing operations, and to assist in patterning those trenches within the interlevel dielectric material. A dielectric cap is also usually applied over the surfaces of the metal lines and the masking layer, to further separate successive levels of metal wiring through metal filled vias in the ILD, masking is employed both to protect the dielectric material between conductors during processing operations, and to assist in patterning those trenches within the interlevel dielectric material. A dielectric cap is also usually applied over the surfaces of the metal lines and the masking layer, to further separate successive levels of metal wiring.

BRIEF DESCRIPTION OF THE DRAWINGS

FIGS. 1A and 1B are dimensionally correlated schematic depictions of a structure of sub 250 nanometer conductive regions at a planarized surface correlated with a graph indicating the locations of high electric field concentrations and illustrating uneven features of the conductive region walls and the present location in the art of masking of the dielectric between conductive regions.

FIG. 2 is a schematic depiction of a prior art intersection of conductive members with a planarized surface such as is present in a standard dual damascene type coplaner mask layer and metal such as copper surface.

DESCRIPTION OF THE INVENTION

Figure 3:
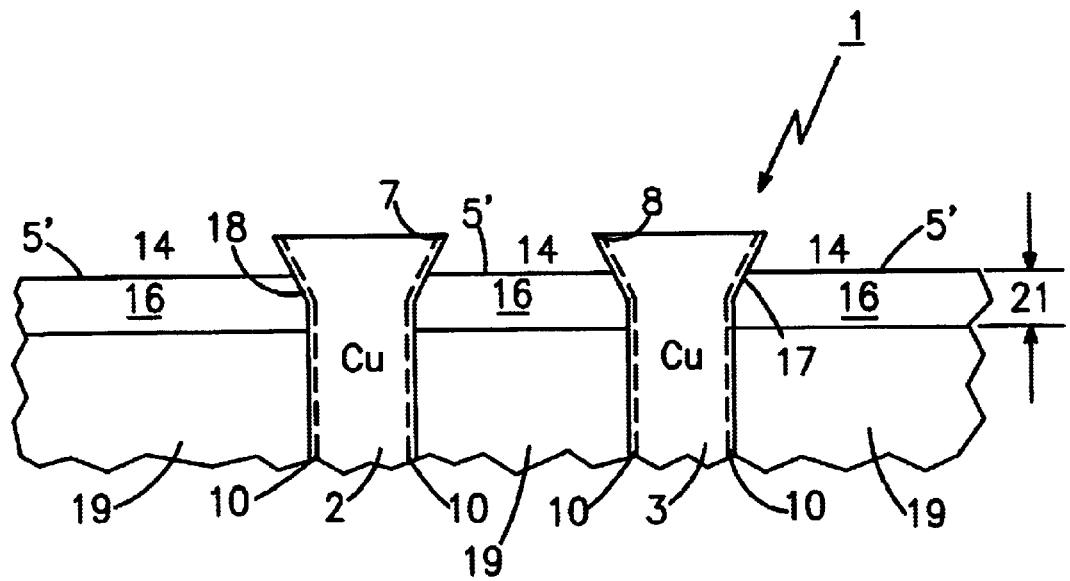
FIGS. 3 and 4 are depictions of structures in the invention herein the intralevel dielectric is positioned below and away from the high electric field locations

Referring to FIG. 1A in the interlevel dielectric member 1 there are illustrated, as an example. two essentially parallel conductive regions 2 and 3. In the sub 250 nanometer dimension range for the width of and separation between elements, a problem is encountered when there is a facetted region 4 where the elements 2 and 3 intersect with the surface 5 which produces pointed locations 6–9, at wich field lines are concentrated thereby producing a high electric field which in turn can cause an electrical breakdown at the pointed region and possibly through any diffusion barrier, which may be a conductive diffusion barrier liner 10. In applications involving metals such as copper, aluminum, silver, gold, and tungsten and alloys thereof, the liner 10 which is usually of tantalum, titanium, tin, or nitrides thereof, routinely serves as a diffusion barrier to any migration. Commonly, the liner 10 may be damaged, thinned or removed in the pointed locations 6–9 during processing. The metal conductor, such as copper, may then migrate onto the surface 5 because the liner 10 has been distributed. As would be known in the art, the facetted region 4 may have a curved radius or a complex shape. The exact shape shown in FIG. 1A being only an example. In FIG. 1B a graph is provided of electric field intensity vs distance across the surface 5 correlated with high electric field concentrations in FIG. 1A. As illustrated in FIG. 1B the higher electric field is not only corresponding to the pointed regions but also extends across the conductive members 2, 3.

Referring to both FIGS. 1A and 1B; the problem produced by the pointed regions 6–9 appears, at this state of the art, to be inherent in dry etching processes such as reactive ion etching, which would be employed in patterning operations at the surface 5. A mask layer 11, shown dotted, is positioned everywhere over the dielectric 1, to protect the dielectric 1 during any operations at the surface 5. One such operation for example would be a deposition followed by a chemical-mechanical planarization of a conductor material 2, 3. A second example is a deposition of further structure or a dielectric cap 13, shown dotted.

The materials of which masks are made vary in both reactive ion etch resistance and in dielectric constant and thus present further considerations in fabrication process selection. Acceptable mask materials are amorphous silicon, carbon, hydrogen ($\alpha$-Si:C:H); silicon, carbon, oxygen, hydrogen alloys (organosiloxane or Si:C:O:H); silicon, nitrogen, carbon alloys (Si:N:C); silicon nitride ($Si_3N_4$); silicon dioxide (Si $O_2$); and, silicon oxynitride (SiON).

The facetted region 4 problem has a detrimental effect on flexibility in the use of materials with different properties and in meeting processing specifications. Of particular concern is the interface between mask layer 11 and the cap layer 13, with the pointed locations 6–9 as shown in FIG. 1A. There are also other aspects of the problem of facetted regions. The pointed regions 6–9 result in smaller line spacing which in the presence of the higher than desirable electric field may result in leakage and breakdown. In general, the presence of the pointed regions 6–9 and the resulting high electric fields is a source of breakdown failures in devices. The mask 11 to cap 13 interface is the location of many of that type of breakdowns of the interface particularly at locations 6–9 and across the conductors 2, 3 where the electric field is magnified as shown in FIG. 1B. A greater propensity for electrical shorting between adjacent lines may also be encountered.

In accordance with the invention a structure and process are provided in which the interface between the mask 11 and cap 13 in FIG. 1A is arranged to be placed at a location that is away from the high electric field points, 1–20 nanometers for example with 2–5 nanometers being preferred; and where the very thin conductive liner diffusion barrier 10 surrounding the conductive members 2 and 3 will have integrity that has not been disturbed by processing up to that point.

Referring to FIG. 2, a schematic depiction is provided of a prior art type standard dual damascene structure with a mask layer 16 and a coplanar mask surface 16' with a metal such as Cu conductor element 2, 3 surface. The facetted problem at points 6–9 is present. In all the Figures the same reference numerals are used for identical elements where appropriate.

Figure 4:
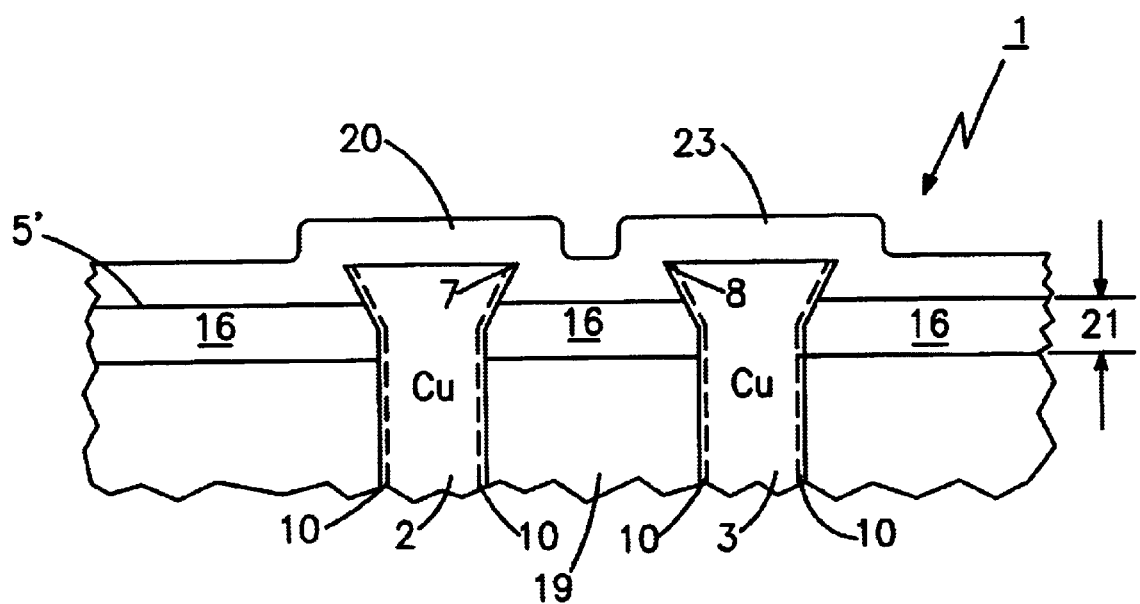

A schematic depiction of is provided of the structure of the invention in the structures shown in FIGS. 3 and 4, wherein a portion 14 of the mask layer 16, has been removed providing a mask to cap interface area 5' that is not coplanar with the pointed locations 6–9, as a result, in the invention ,the mask member 16 itself is then positioned so that the high field points 7 and 8 are separated from the interface 5' and the interfaces 17 and 18 of the mask 16 are at portions of the conductive members 2 and 3 where the liner 10 is undisturbed. Such disturbance frequently occurs during chemical-mechanical processing, and is frequently mainfested as damage to the liner 10 near the locations 6–9. The portion of the low k dielectric material 1, being covered and protected by the mask 16, is labelled element 19. A conformal cap layer is labelled element 20.

The mask 16 is usually of a harder low k dielectric, such as amorphous silicon,carbon, hydrogen ($\alpha$-Si:C:H); silicon, carbon, oxygen, hydrogen alloys (organosiloxane or Si:C:O:H); silicon, nitrogen, carbon alloys (Si:N:C); silicon nitride($Si_3N_4$); silicon dioxide (Si $O_2$); and, silicon oxynitride (SiON). The liner 10 may be a conductive diffusion barrier film such as Ta, Ti, TaN, TiN, W or WN or combinations thereof. Examples of low k ILD materials are listed in the above referenced Semiconductor International Magazine article.

Referring to FIG. 4, the cap element 20 is typically conformally deposited over the surfaces 5'. Many standard deposition processes of the plasma enhanced chemical vapor deposition type produce a conformal cap layer 20 as shown. Alternatively, the top surface 23 of the cap 20 can be made approximately planar using a deposition process consisting of a conformal step followed by planarizng step to level discontinuities.

The recessed mask structure is achieved through a unique process that permits both: the benefit of having a recessed surface of the mask with respect to a device surface where there may be aspects to avoid, such as high electric field concentration points; and the benefit of having a final mask thickness that is selectable and no thicker than necessary. Mask material generally has a k value that is higher than the ILD material k value thus increasing the overall capacitance value so that using quantities for as thin a mask as possible is desirable. The process in general involves removing mask material between points 7 and 8 after chemical-mechanical polishing, down to a level that is away from the surface 5 where the high fields, points 7 and 8 are located and continuing until a selected mask thickness, dimension 21, is reached.

Another embodiment of the invention involves using the material silicon nitride as the mask 16. The etch process to decrease the layer 16 to dimension 21 is performed through the use of an etch tool such as is available in the art from the Applied Materials corporation identified as IPS and using with the tool a mixture of gasses chosen from the group of $O_2$; $CH_3F$; $CH_2F_2$; Ar; $NH_3$; $NF_3$; He; and $H_2$. The gas flow rate is in the range of 1–100 sccm; at a power of 100–300 watts; at a pressure in a range of 1 to 100 milliTorr with a bias power of the range of 50–500 watts.

Still another alternative involves no mask layer and employs an inorganic material for the intralevel dielectric selected from the group of silicon dioxide, fluorosilicate glass, and carbon doped oxide. In this alternative the intralevel dielectric is recessed by etching below the surface of the conductors 2, 3.

There are several beneficial features achieved with the invention. The high field at points 7 and 8 are now away from the cap 20-mask 16 interface at 5'. The material of the mask 16 which usually has a higher k and which can affect overall dielectric properties of the device can be minimized with dimension 21 being selected independently of consideration for the planarization process of surface 5 since it is positioned through the invention after the planarization operation. Any damage from planarization operations to the conductive liner 10 at the points 6–9 is minimized, so the metal Cu of 2 and 3 does not breach the barrier and contaminate the interface 5'.

The recessed mask structure of the invention in addition to providing the above described benefits also provides, when integrated into a component, a lower and predictable overall capacitance which parameter in turn is very valuable because it results in faster signal propagation in the interconnect wiring.

Figure 5:
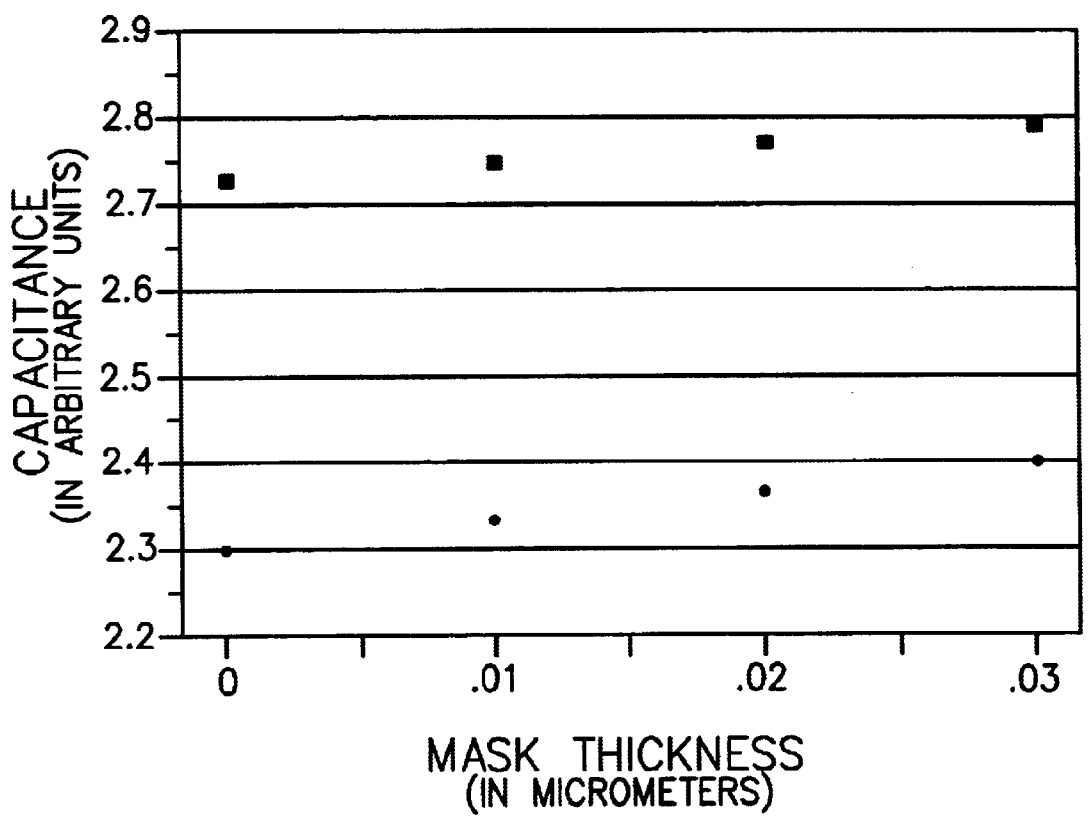
FIG. 5 is a graph of capacitance vs thickness of mask positioned in accordance with the invention illustrating an overall lower capacitance of the inventive structure.

Referring to FIG. 5 which is a graph of capacitance vs thickness 21 of mask positioned in accordance with the invention. From the graph of FIG. 5 it is clear,that the inventive structure has a lower capacitance.

Returning to FIG. 4, The material used in masking is generally referred to as hard with respect to chemical mechanical processes and such materials have a higher k value. In the structure of the invention the high k mask 16 is positioned in an opening between conductors 2 and 3 so that the overall capacitance decreases as more of the hard mask is recessed.

In general with the invention there will be a smaller thickness of the high k material and what high k material there is will be recessed below the locations 6–9 of highest electric field. Both of these aspects lead to the lower capacitance of the invention structure.

The structure of the invention, following generally FIGS. 3 and 4, is made using a standard substrate in the art of a material such as silicon on which is deposited a bulk layer of intralevel dielectric material 1 such as an organic thermoset polymer or an inorganic alloy comprised of Si, O, H or Si, C, O, H such as carbon doped oxide, in which via and trench openings as used in damascene type structures have been etched using a mask layer 16.

The etched openings 2 and 3 are provided with conductive diffusion barrier liners 10 of Ta, Ti, TaN, TiN, W or WN, by chemical or physical vapor deposition. The liner 10 in this process which serves as an adhesion layer between the intralevel dielectric and a thin copper layer, not shown, is used in this process as an electroplating conductor for electroplating more copper into and filling the openings 2 and 3. The surface 5 is then chemically-mechanically polished until the copper conductors are nearly coplanar with the mask surface 16'. A different, chemical-mechanical slurry is then used to remove any remaining liner 10 material which step may disturb the liner 10.

The partially processed substrate is gently etched with a downstream plasma or reactive ion etch tool to move the interface 5' away from the surface 5 to establish the dimension 21. In a preferred method this is done with a plasma tool wherein the sample being bombarded is placed at a temperature of 250 degrees C. downstream from a 950 watts inductive RF field in a forming gas atmosphere for about 10 to 200 seconds with 100 being preferred. The downstream location may be viewed as being out of the line of sight between the substrate and the plasma. Using an etch tool, such as for example the one available in the art known as the Mattson ICP; and in a forming gas in a flow of about 0.5 standard liters per minute(sccm) and at a pressure of about 1.1 Torr; a satisfactory etch rate of about 2 nanometers per minute of $\alpha$-Si:C:H is achieved. Flow rates from 0.1 to 1.0 standard liters per minute of forming gas produces the same etch rate.

In an alternative structure of the invention a mask layer of a separate material can be avoided by establishing the surface of the intralevel dielectric material at a location that is in the range of between 1–20 nanometers with 2–5 nanometers being preferred, below the surface of the metal conductors.

What has been described is a technology that permits the formation at small dimension interconnections between difficult to use materials in semiconductor devices by moving interfaces away from high fields and controlling capacitance through use of only as much of a high capacitance contributing ingredient as essential.

What is claimed is:

1. In a semiconductor device wherein conductive interconnection members are inlaid into and separated at a surface by a dielectric member, the spacing of said conductive interconnection members at said surface being in the sub 250 nanometer range, and said conductive interconnection members exhibiting high electric field concentrations at said surface, an improvement comprising:
 a mask member extending over all of said dielectric member from a first conductive interconnection member to a second conductive interconnection member,
 said mask member being positioned in contact with said dielectric member and intersecting said conductive interconnection members at a location that is separated from said surface.

2. The improvement of claim 1 wherein the material of said conductive interconnection members is at least one member of the group comprising copper, aluminum silver, gold and alloys thereof.

3. The improvement of claim 2 wherein the material of said mask member is a at least one material taken from the group of amorphous silicon, carbon, hydrogen ($\alpha$-Si:C:H); silicon, carbon, oxygen, hydrogen alloys (organosiloxane or Si:C:O:H); silicon, nitrogen, carbon alloys (Si:N:C); silicon nitride ($Si_3N_4$); silicon dioxide(Si $O_2$); and, silicon oxynitride (SiON).

4. The improvement of claim 1 wherein said mask member has a thickness related to the capacitance of said conductive interconnect members.

5. The improvement of claim 1 wherein said location of said mask member intersecting with said conductive interconnect members is separated from said surface a distance in the range of 1 to 20 nanometers.

6. The improvement of claim 5 wherein said location of said mask member intersecting said conductive interconnect members is separated from said surface a distance of 5 nanometers.

7. The improvement of claim 6 wherein said conductive interconnect members in said dielectric member are surrounded by an electrically conductive diffusion barrier liner.

8. The improvement of claim 7 wherein said liner is of a material taken from the group of at least one of Ta, Ti, TaN, TiN, W and WN.

9. A semiconductor device wherein conductive interconnection members are inlaid into and separated at a surface of a bulk dielectric member, the spacing of said conductive interconnection members at said surface being in the sub 250 nanometer range, and said conductive interconnection members exhibiting high electric field concentrations at said surface, an improvement comprising:
 a mask member of at least one material taken from the group of amorphous silicon, carbon, hydrogen ($\alpha$-Si:C:H); silicon, carbon, oxygen, hydrogen alloys (organosiloxane or Si:C:O:H); silicon, nitrogen, carbon alloys (Si:N:C); silicon nitride ($Si_3N_4$); silicon dioxide(Si $O_2$); and, silicon oxynitride (SiON); extending over all of said dielectric member from a first conductive interconnection member to a second conductive interconnection member,
 said conductive interconnect members being of at least one material taken from the group of copper, aluminum, silver, gold and alloys thereof
 said mask member being positioned in contact with said bulk dielectric member and intersecting said conductive interconnection members at a location that is separated from said surface.

10. The device of claim 9 wherein conductive interconnect members in said bulk dielectric member are surrounded by an electrically conductive diffusion barrier liner.

11. The device of claim 9 wherein said liner is of a material taken from the group of at least one of Ta, Ti, TaN, TiN, W and WN.

12. A semiconductor device wherein conductive interconnection members are inlaid into and separated at a surface of a bulk dielectric member, the spacing of said conductive interconnection members at said surface being in the sub 250 nanometer range, and said conductive interconnection members exhibiting high electric field concentrations at said surface, an improvement comprising:
 said conductive interconnect members being of at least one material taken from the group of copper, aluminum, silver, gold and alloys thereof,
 said conductive interconnect members extending above the surface of said intralevel dielectric a distance in the range of from 1–20 nanometers.

13. The device of claim 12 wherein said distance said conductive interconnect members extend above said surface of said intralevel dielectric is from 2–5nanometers.

* * * * *